(12) United States Patent
Enomoto et al.

(10) Patent No.: US 6,586,686 B1
(45) Date of Patent: Jul. 1, 2003

(54) MULTILAYER PRINTED WIRING BOARD AND METHOD FOR MANUFACTURING THE SAME

(75) Inventors: Ryo Enomoto, Gihu (JP); Yasuji Hiramatsu, Gihu (JP)

(73) Assignee: Ibiden Co., Ltd. (JP)

( * ) Notice: Subject to any disclaimer, the term of this patent is extended or adjusted under 35 U.S.C. 154(b) by 0 days.

(21) Appl. No.: 09/454,905

(22) Filed: Dec. 2, 1999

Related U.S. Application Data (63) Continuation of application No. PCT/JP98/02497, filed on Jun. 5, 1998.

(30) Foreign Application Priority Data

Jun. 6, 1997 (JP) .............................................. 9-165291

(51) Int. Cl.$^7$ ............................................ H01R 12/04
(52) U.S. Cl. ..................................................... 174/262
(58) Field of Search ................................ 174/262, 263, 174/255, 259, 256; 361/748, 750, 751

(56) References Cited

U.S. PATENT DOCUMENTS

| 5,274,912 A | * | 1/1994 | Olenick et al. | 29/830 |
| 5,291,062 A | | 3/1994 | Higgins, III | 257/698 |
| 5,367,435 A | | 11/1994 | Andros et al. | 361/749 |
| 5,633,072 A | * | 5/1997 | Middelman et al. | 428/209 |
| 5,764,485 A | | 6/1998 | Lebaschi | 361/774 |
| 5,839,188 A | * | 11/1998 | Pommer | 29/830 |
| 5,879,787 A | | 3/1999 | Petefish | 428/209 |
| 6,037,044 A | | 3/2000 | Giri et al. | 428/209 |

OTHER PUBLICATIONS

Appl. No.: 04217470, Jul. 24, 1992, Pub. No.: 06045722A, Feb. 18, 1994, Japan, abstract.

(List continued on next page.)

Primary Examiner—Tulsidas Patel
(74) Attorney, Agent, or Firm—Welsh & Katz, Ltd.; Thomas W. Tolpin (57) ABSTRACT

Holes (40a) are formed with a laser beam through an insulating substrate (40) on which a metallic layer (42) if formed. After the holes (40A) are formed, via holes (36a) are formed by filling up the holes (40a) with a metal (46) and a conductor circuit (32a) is formed by etching the metallic layer (42). Then, a single-sided circuit board (30A) is formed by forming projecting conductors (38a) on the surfaces of the via holes (36a). The projecting conductors (38a) of the circuit board (30A) are put on the conductor circuit (32b) of another single-sided circuit board (30B) with adhesive layers (50) composed of an uncured resin in between and heated and pressed against the circuit (32b). The projecting conductors (38a) get in the uncured resin by pushing aside the resin and are electrically connected to the circuit (32b). Since single-sided circuit boards (30A, 30B, 30C, and 30D) can be inspected for defective parts before the boards (30A, 30B, 30C, and 30D) are laminated upon another, only defectless single-sided circuit boards can be used in the step of lamination.

31 Claims, 9 Drawing Sheets

OTHER PUBLICATIONS

Appl. No.: 01285337, Oct. 31, 1989, Pub. No.: 03145791A, Jun. 20, 1991, Japan, abstract.
Appl. No.: 61087834, Apr. 16, 1986, Pub. No.: 62244156A, Oct. 24, 1987, Japan, abstract.
Appl. No.: 05143330, Jun. 15, 1993, Pub. No.: 07014942A, Jan. 17, 1995, Japan, abstract.
Appl. No.: 07036294, Jan. 31, 1995, Pub. No.: 08213748A, Aug. 20, 1996, Japan, abstract.
Appl. No.: 07305208, Oct. 31, 1995, Pub. No.: 09130038A, May 16, 1997, Japan, abstract.
Appl. No.: 05142466, Jun. 15, 1993, Pub. No.: 07007264A, Jan. 10, 1995, Japan, abstract.
Appl. No.: 07078631, Apr. 4, 1995, Pub. No. 08279678A, Oct. 22, 1996, Japan, abstract.
Appl. No.: 01086559, Apr. 5, 1989, Pub. No.: 02265294A, Oct. 30, 1990, Japan, abstract.
Publication: The 9th National Convention Record JIPC, Mar., 1995, Tokyo.
Appl. No.: 05111596, May 13, 1993, Pub. No.: 06326438, Nov. 25, 1994, Japan, abstract.
Appl. No.: 08269719, Oct. 11, 1996, Pub. No.: 10117067, May 6, 1998, Japan, abstract.
Appl. No.: 02288796, Oct. 25, 1990, Pub. No.: 04162589, Jun. 8, 1992, Japan, abstract.

* cited by examiner

MULTILAYER PRINTED WIRING BOARD AND METHOD FOR MANUFACTURING THE SAME

This application is a continuaiton of PCT/JP98/02497 filed Jun. 5, 1998.

BACKGROUND OF THE INVENTION

1. Field of the Invention

The present invention relates to a multilayer printed wiring board and method for manufacturing the same, and more particularly to a multilayer printed wiring board having an interstitial via hole (IVH) structure and a method for manufacturing the same.

2. Description of the Related Art

A conventional multilayer printed circuit board is constituted by a laminate obtained by alternately laminating copper-clad laminates and prepregs. The laminate has a surface on which a surface wiring pattern has been formed. Moreover, an internal wiring pattern is formed between interlayer insulating layers. Through holes are, by punching formed in the direction of the thickness of the laminate to establish the electric connections among internal wiring patterns or among internal wiring patterns and the surface wiring patterns.

The multilayer printed circuit board having the above-mentioned through hole structure must have regions for forming the through holes. Therefore, the density at which elements are mounted cannot be easily raised. As a result, there arises a problem in that the multilayer printed circuit board having the through hole structure cannot easily address needs for considerable reductions in the sizes of the portable electronic apparatuses, realizing narrow pitch packages and practical use of MCM.

As an alternative to the foregoing multilayer printed circuit board having the through hole structure, a multilayer printed circuit board has recently received attention which is formed into a full-thickness interstitial via-hole (IVH) structure which is able to easily address raising of the density.

The multilayer printed circuit board having the full-thickness IVH structure is a printed circuit board having a structure in which via holes for electrically connecting conductive layers to one another are formed in each of the interlayer insulating layers which constitute the laminate. That is, the foregoing printed circuit board has the via holes (buried via holes or blind via holes) which do not penetrate the substrate on which the circuit is formed and which electrically connect the internal wiring patterns to one another or the internal wiring patterns and the surface wiring patterns to one another. Therefore, the multilayer printed circuit board having the IVH structure is free from a necessity of specially forming regions for forming the through holes. Therefore, arbitrary layers can freely be connected to one another through small via holes. As a result, size reduction, high density and high-speed propagation of signals can be easily realized.

Figure 6:
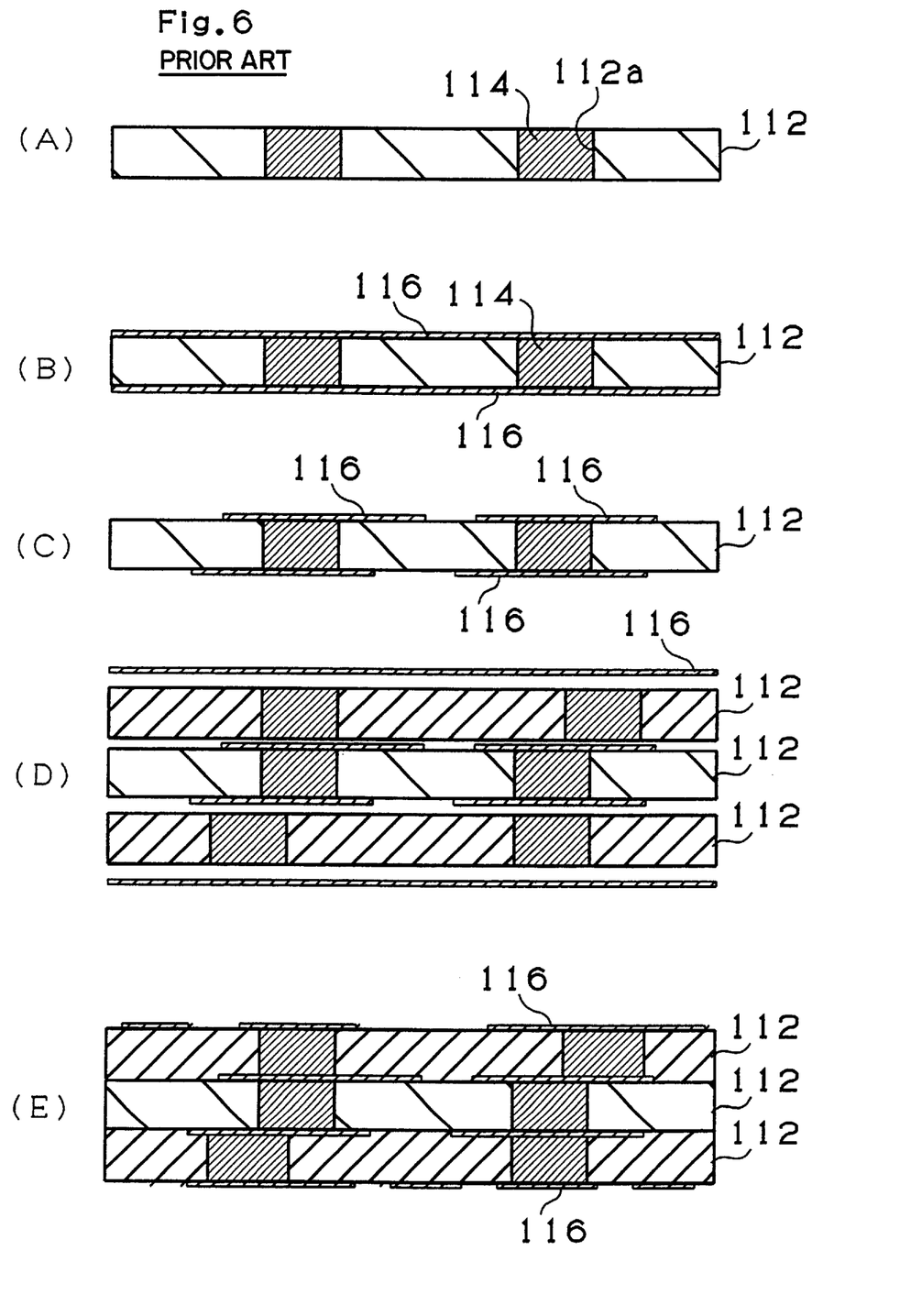
FIG. 6 is a diagram showing a process for manufacturing a conventional multilayer printed circuit board.

The multilayer printed circuit board having the IVH structure is manufactured by a process arranged, for example, as shown in FIG. 6.

Initially, a material having a structure in which an aramide nonwoven fabric cloth is impregnated with epoxy resin is employed as prepreg 112. Then, an operation for forming holes in the prepreg 112 is performed by using carbon dioxide gas laser. Then, conductive paste 114 is enclosed in obtained hole portions 112a (see FIG. 6 (A)).

Then, copper foil 116 is laminated on each of the two sides of the prepreg 112, and then heat and pressure are applied to the prepreg 112 having the copper foil 116 by heat pressing. Hence it follows that the epoxy resin and the conductive paste of the prepreg 112 are hardened so that the electrical connection between the two copper foil members 116 on the two sides of the prepreg 112 is established (see FIG. 6 (B)).

Then, the copper foil 116 on each side is patterned by an etching method so that a hard and double-sided substrate having via holes is obtained (see FIG. 6 (C)).

Then, the obtained double-sided substrates are used as core layers to form a multilayer structure. Specifically, the prepreg and copper foil are sequentially laminated on the two sides of the foregoing core layer while the prepreg and the copper foil are being aligned. Then, heat pressing is again performed, and then the uppermost copper foil 116 is etched. Thus, a four-layer substrate is obtained (see FIGS. 6 (D) and 6 (E)). When a structure having a large number of layers is formed, the foregoing process is repeated. Thus, a six-layer substrate or an eight-layer substrate can be obtained.

The foregoing conventional technique, however, must repeat the laminating process using heat pressing and the process for patterning the copper foil by performing the etching operation. Therefore, the manufacturing process becomes too complicated and considerable time is required to complete the manufacturing operation.

If the multilayer printed circuit board having the IVH structure which can be obtained by the above-mentioned manufacturing method encounters only one defective portion (only one defective process) in the patterning operation during the manufacturing process, the overall circuit board, which is the final product, becomes a defective product. Hence it follows that the manufacturing yield deteriorates excessively.

To overcome the above-mentioned problems, an object of the present invention is to provide a high-density multilayer printed circuit board having the IVH structure which can be manufactured by a very simple process and which permits a satisfactory high manufacturing yield to be realized and a manufacturing method therefor.

BRIEF SUMMARY OF THE INVENTION

To achieve the above-mentioned object, the present invention is structured as follows.

According to one aspect of the present invention, there is provided a method of manufacturing a multilayer printed circuit board comprising the steps (1) to (5):

(1) a step for forming a non-penetrating hole in an insulating base member, such as an organic insulating base member, having a metal layer formed on either surface thereof by a laser irradiation operation such that the non-penetrating hole reaches the metal layer;

(2) a step for forming via holes by enclosing a conductive material into the non-penetrating hole formed in step (1);

(3) a step for forming a conductive circuit by etching the metal layer;

(4) a step for forming projecting conductors on the surfaces of the via holes to form a single-sided circuit substrate;

(5) a step for laminating the single-sided circuit substrate and another single-sided circuit substrate or the single-sided circuit substrate and another substrate obtained in the steps (1) to (4) such that the projecting conductors of the single-sided circuit substrate and a conductive circuit of the other circuit are positioned opposite to each other through non-hardened resin which is an organic adhesive layer and applying heat and pressure to (heat-pressing) the laminate.

According to another aspect of the present invention, there is provided a method of manufacturing a multilayer printed circuit board comprising the steps (1) to (4):

(1) a step for forming a non-penetrating hole in an insulating base member, such as an organic insulating base member having a metal layer formed on either surface thereof by a laser irradiation operation such that the non-penetrating hole reaches the metal layer;

(2) a step for forming via holes by enclosing a conductive material into the non-penetrating hole formed in step (1) and forming projecting conductors on the surfaces of the via holes;

(3) a step for forming a conductive circuit by etching the metal layer;

(4) a step for laminating the single-sided circuit substrate and another single-sided circuit substrate or the single-sided circuit substrate and another substrate such that the projecting conductors of the single-sided circuit substrate and a conductive circuit of the other single-sided circuit substrate or the other conductive circuit are positioned opposite to each other through non-hardened resin which is an organic adhesive layer and applying heat and pressure to (heat pressing) the laminate.

In the foregoing aspects of the present invention, the projecting conductors are inserted into the non-hardened resin so that resin is squeezed out. That is, the projecting conductors penetrate the organic adhesive layer so as to be electrically connected to another substrate.

According to another aspect of the present invention, there is provided a multilayer printed circuit board obtainable from the above-mentioned manufacturing process.

That is, a multilayer printed circuit board having a structure that single-sided circuit substrates each of which has a conductive circuit formed on either side of an organic insulating base member thereof and via holes formed in the organic insulating base member by enclosing a conductive material are connected to other substrates each having a conductive circuit through organic adhesive layers, the multilayer printed circuit board comprising: projecting conductors formed on the surfaces of the via holes opposite to the surface of the organic insulating base member on which the conductive circuit is formed, wherein the projecting conductors are inserted to penetrate the adhesive layers so as to be connected to the conductive circuits of the other substrates.

The multilayer printed circuit board and a manufacturing method therefor according to the present invention are arranged such that the single-sided circuit substrates each having a conductive circuit which incorporates a predetermined wiring pattern formed thereon are previously and individually manufactured. Therefore, inspection for detecting whether or not the conductive circuit or the like has a defective portion can be performed before the single-sided circuit substrates are laminated. Hence it follows that only single-sided circuit substrates free from any defect can be used in the laminating process. That is, the manufacturing method according to the present invention is able to reduce defects in the manufacturing process. As a result, the multilayer printed circuit board having the IVH structure can be manufactured with a high manufacturing yield.

The method of manufacturing a multilayer printed circuit board according to the present invention is not required to repeat the heating press operation while the prepreg is being laminated as distinct from the conventional technique. That is, the present invention enables the heat pressing operation to be completed at a time such that a plurality of the single-sided circuit substrates are laminated through the adhesive agents placed on the single-sided circuit substrates. Therefore, the manufacturing method according to the present invention is free from a necessity for repeating the laminating process, in which the complicated heat press is performed, and the patterning process. Hence it follows that the multilayer printed circuit board having the IVH structure can be efficiently manufactured.

In the present invention, formation of the non-penetrating holes in the organic insulating substrate is performed by laser machining. The structure of the present invention is able to eliminate the necessity of forming holes in the organic adhesive agent by performing a laser process. That is, after holes have been formed in the organic insulating substrate by performing the laser process, the organic adhesive layer can be formed on the single-sided circuit substrate or the substrate having the conductor circuit.

That is, the present invention is structured such that the projecting conductors inserted into the organic adhesive layer during the heat pressing establish the connection of the conductor circuits. Therefore, previous formation of the conducting hole in the organic adhesive layer is not required. The organic adhesive layer may be formed at the final heat pressing process. As a result, the desmear process, which is performed after the hole has been formed in the process for manufacturing the single-sided circuit substrate, may be performed before the formation of the organic adhesive layer. Hence it follows that the desmear process does not erode the organic adhesive layer.

Also in a case where the non-penetrating hole is filled with the electrolytic plating, the organic adhesive layer can be formed on the single-sided circuit substrate or the substrate having the conductive circuit after the non-penetrating hole has been formed in the organic insulating base member by performing the laser process and the non-penetrating hole has been filled with the electrolytic plating. Therefore, the electrolytic plating solution and the organic adhesive layer are not made contact with each other. As a result, the erosion and contamination of the organic adhesive layer with the plating solution can be prevented.

Since the organic adhesive layer is not hardened until the heat pressing process which is the final process is performed, the organic adhesive layer easily deteriorates owing to the desmear process and the plating solution. The present invention is characterized in that the foregoing problem can be prevented and a reliable substrate can easily be formed.

Moreover, a necessity for previously forming a conducting hole in the adhesive layer can be eliminated. Therefore, defective conduction caused from deviation in the positions of the hole in the adhesive layer and the projecting conductors provided for the organic insulating base member can be prevented.

In the present invention, the projecting conductors are formed on the via holes filled with the conductive paste or the electrolytic plating. Therefore, electrical connection between the upper and lower conductive layers can be easily established by penetrating the relatively thin organic adhesive layer. Therefore, the height and the diameter of each projecting conductor can be reduced. Hence it follows that the pitch between adjacent projecting conductors can be shortened. Therefore, the pitch between adjacent via holes can also be shortened. As a result, addressing to raising of the density can be permitted.

In a case where the via holes are filled with the electrolytic plating, the resistance value between the upper and the lower conductor layers can be lowered.

Techniques for connecting the upper and lower conductors to each other by penetrating the resin insulating layer have been disclosed in Japanese Patent Laid-Open No. 7-14628, Japanese Patent Laid-Open No. 7-106756, Japanese Patent Laid-Open No. 7-231167, Japanese Patent Laid-Open No. 8-172270 and Japanese Patent Laid-Open No. 8-288649. The foregoing techniques are different from the technique with which the projecting conductors formed on the via holes filled with the foregoing material are caused to penetrate only the organic adhesive layer to connect the upper and lower conductors to each other. Therefore, the effect of the present invention cannot be obtained.

DETAILED DESCRIPTION OF THE INVENTION

Preferred embodiments if the invention and the best modes for carrying out the invention are described herein.

A multilayer printed circuit board and a manufacturing method therefor according to an embodiment of the present invention will now be described with reference to the drawings.

Figure 1:
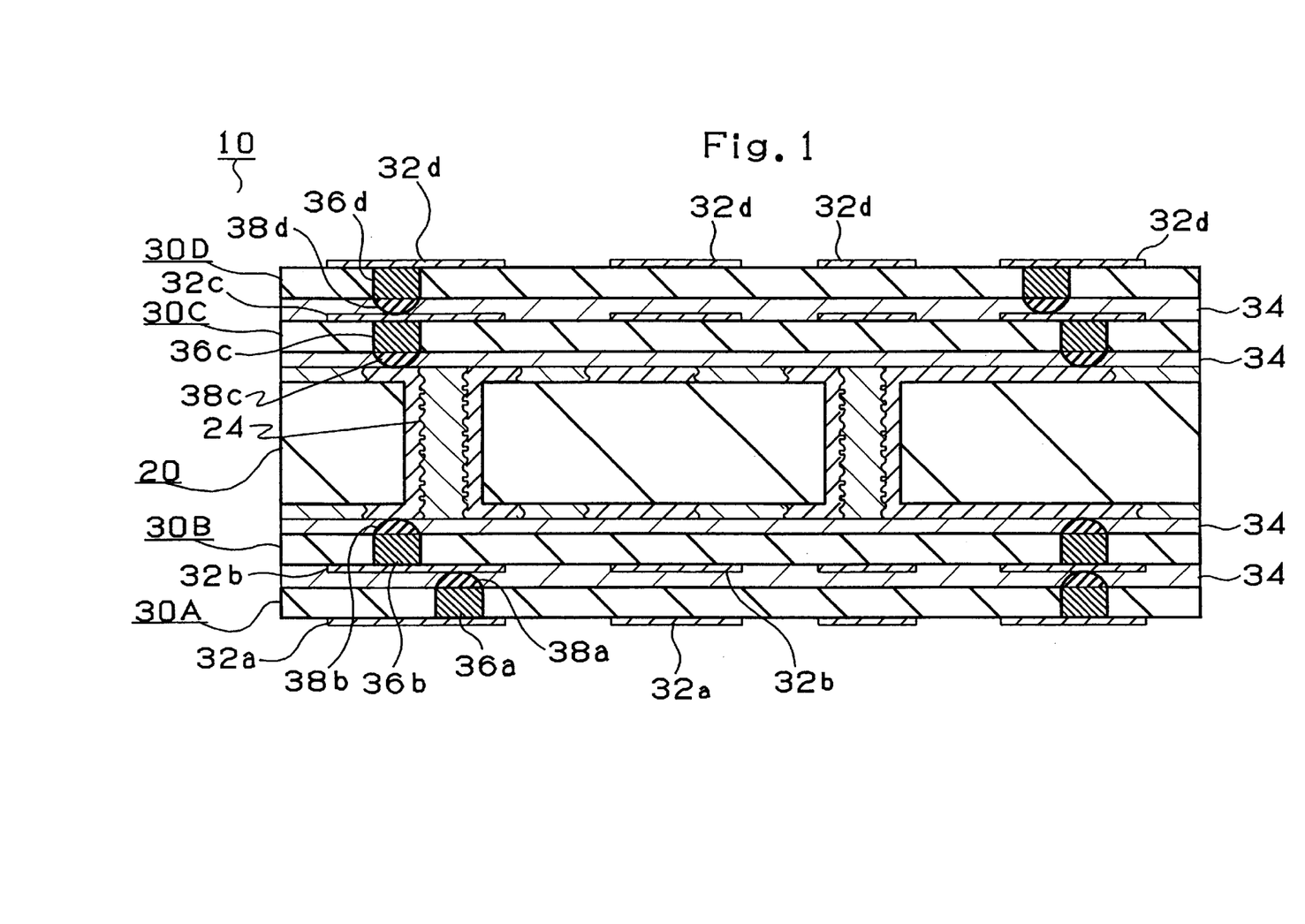
FIG. 1 is a vertical cross sectional view showing a multilayer printed circuit board according to an embodiment of the present invention.

FIG. 1 shows a vertical cross section of a multilayer printed circuit board having a full-thickness IVH structure according to the embodiment of the present invention. A multilayer printed circuit board 10 is a multilayer printed circuit board incorporating a core substrate 20 disposed in a central portion of the multilayer printed circuit board 10 and single-sided circuit substrates 30A, 30B, 30C and 30D, two substrates of which are formed on the upper surface of the core substrate 20 and the lower surface of the same, respectively.

Conductive circuits 32a, 32b, 32c and 32d each having a predetermined pattern are formed on the surfaces of the corresponding single-sided circuit substrates 30A, 30B, 30C and 30D. Adhesive layers 34 are formed on other surfaces of the same. The core substrate 20 and the single-sided circuit substrates 30A, 30B, 30C and 30D are bonded to one another through the adhesive layers 34. The single-sided circuit substrates 30A, 30B, 30C and 30D have corresponding via holes 36a, 36b, 36c and 36d formed by enclosing electrolytic copper plating. Projecting conductors (hereinafter called "bumps") 38a, 38b, 38c and 38d made of metal, such as solder or an indium alloy or conductive paste, are formed on the foregoing via holes (the surfaces of the via holes opposite to the surfaces on which the conductive circuits are formed).

That is, in the multilayer printed circuit board 10, a conductive circuit 32a of the lowermost single-sided circuit substrate 30A is connected to a bump 38a through the via hole 36a. The bump 38a is made contact with a conductive circuit 32b of the single-sided circuit substrate 30B to establish the connection between the two circuits. The bump 38b connected to the conductive circuit 32b through the via hole 36b is made contact with the via hole 24 of the core substrate 20 so that conduction is realized. The via hole 24 of the core substrate 20 is connected to the bump 38c of the upper single-sided circuit substrate 30C. The conductive circuit 32c connected to the bump 38c through the via hole 36c is connected to the bump 38d of the uppermost single-sided circuit substrate 30D. The bump 38d is connected to the conductive circuit 32d through the via hole 36d. An electronic element, such as a bear chip, can be mounted on either surface or two surfaces of the uppermost single-sided circuit substrate 30D. Thus, the conductive circuit 32a of the lowermost single-sided circuit substrate 30A of the multilayer printed circuit board and the chip element (not shown) mounted on the conductive circuit 32 of the uppermost single-sided circuit substrate 30D are connected to each other through the via holes 36a, 36b, 36c and 36d. The foregoing via holes constitute interstitial via holes.

The method of manufacturing the multilayer printed circuit board 10 will now be continued. A method of manufacturing the core substrate 20 will now be described with reference to FIG. 2.

The core substrate may be a known rigid substrate, such as an epoxy resin substrate having a glass cloth base member or a BT (Bismaleimide-Triazine) resin substrate having a glass cloth base member.

Figure 2:
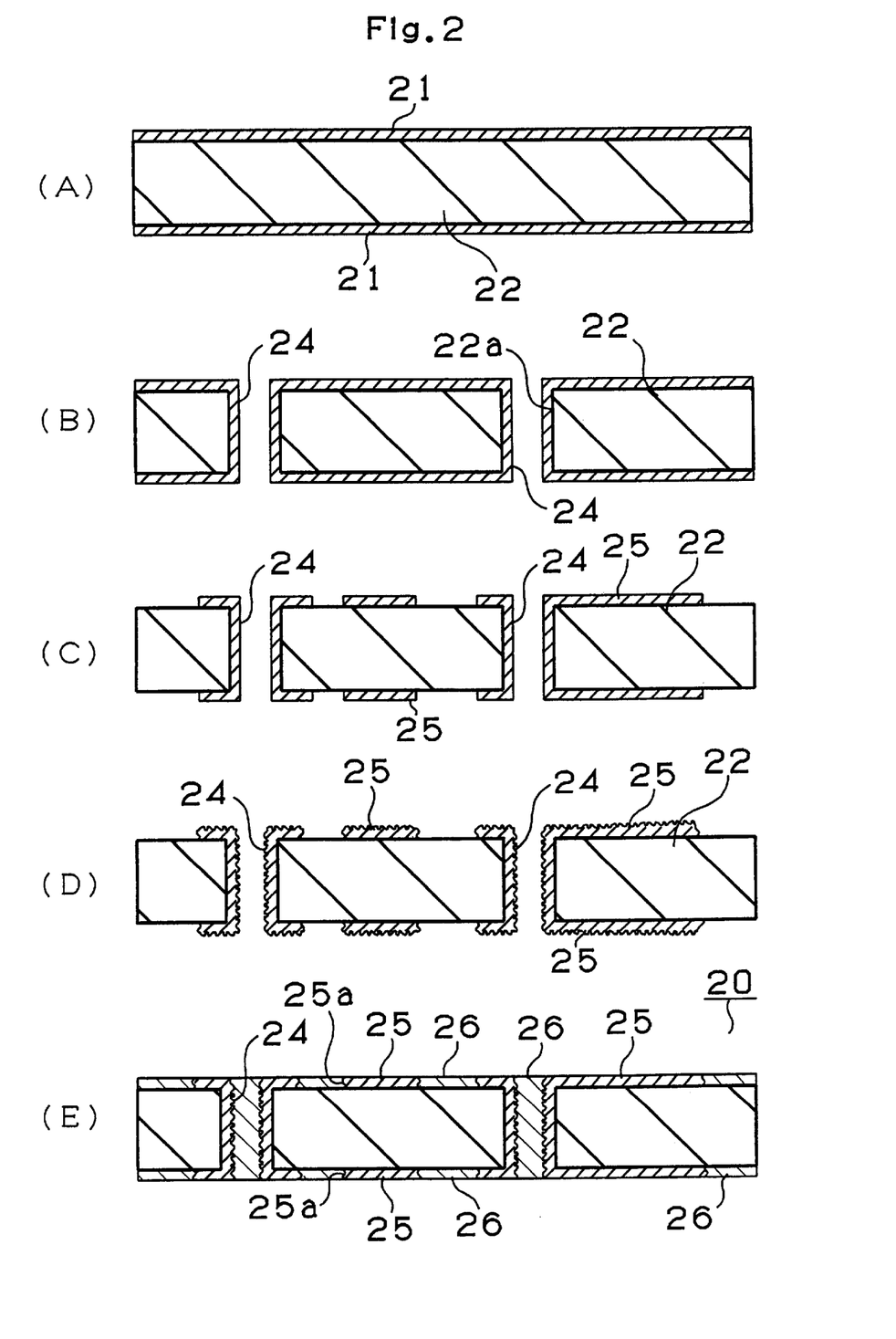
FIG. 2 is a diagram showing a process for manufacturing a core substrate which constitutes the multilayer printed circuit board according to the embodiment of the present invention.

Specifically, in process (A) shown in FIG. 2, a starting material is copper-clad laminates incorporating a substrate 22 which is made of BT (Bismaleimide-Triazine) resin and which has two sides on each of which copper foil 21 is bonded. In process (B), holes 22a serving as through holes are formed in the substrate 22 by punching, and then electroless plating is performed so that the inner surfaces of the holes 22a are applied with copper plating. Thus, via holes 24 are formed.

In process (C), etching resist (not shown) is previously applied, and then an etching process is performed to remove unnecessary portions of the copper foil 21. As a result, a predetermined conductive circuit 25 is formed.

In process (D), the surfaces of the conductive circuit 25 and the through holes 24 are subjected to blacking-reducing process so as to be coarsened.

In process (E), resin 26 which must be enclosed is uniformly applied by using a roll coater, and then the resin which must be enclosed is hardened. Then, the resin which must be enclosed is ground with a belt sander or the like until the conductive circuit 25 is exposed on the surface. As a result, a core substrate 20 having two flat surfaces is manufactured.

The core substrate 20 is brought to a state in which the inside portion of the through holes 24 and two sides 25*a* of the conductive circuit 25 are coarsened. As a result, the adhesiveness between the conductive circuit 25 and the resin 26 which must be enclosed can be improved. Hence it follows that occurrence of a crack can be prevented which occurs in the adhesive layer 34 described with reference to FIG. 1 and which starts at the interface between the conductive circuit 25 and the resin 26 which must be enclosed.

Figure 3:
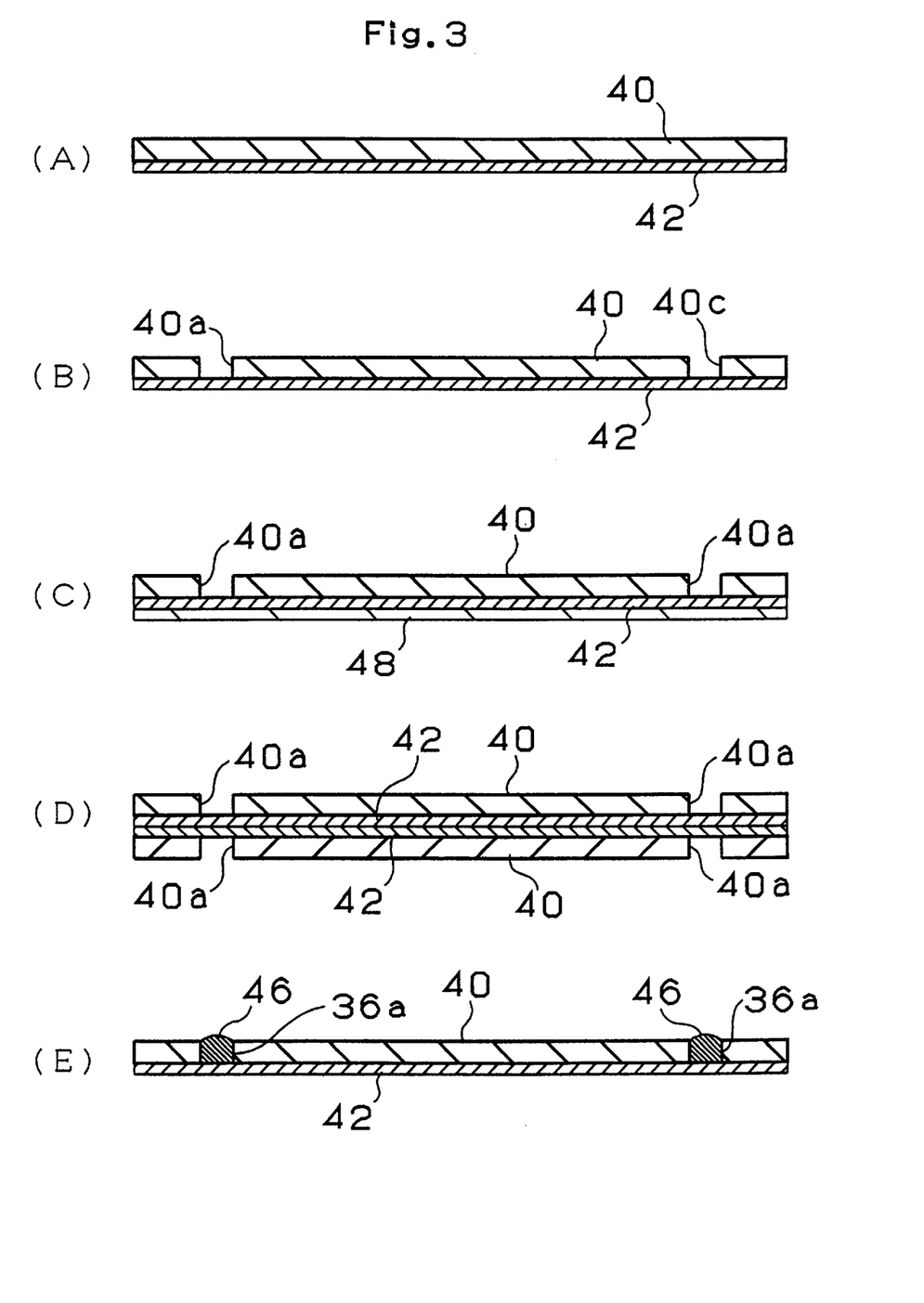
FIG. 3 is a diagram showing a process for manufacturing a single-sided circuit substrate which constitutes the multilayer printed circuit board according to the embodiment of the present invention.
Figure 4:
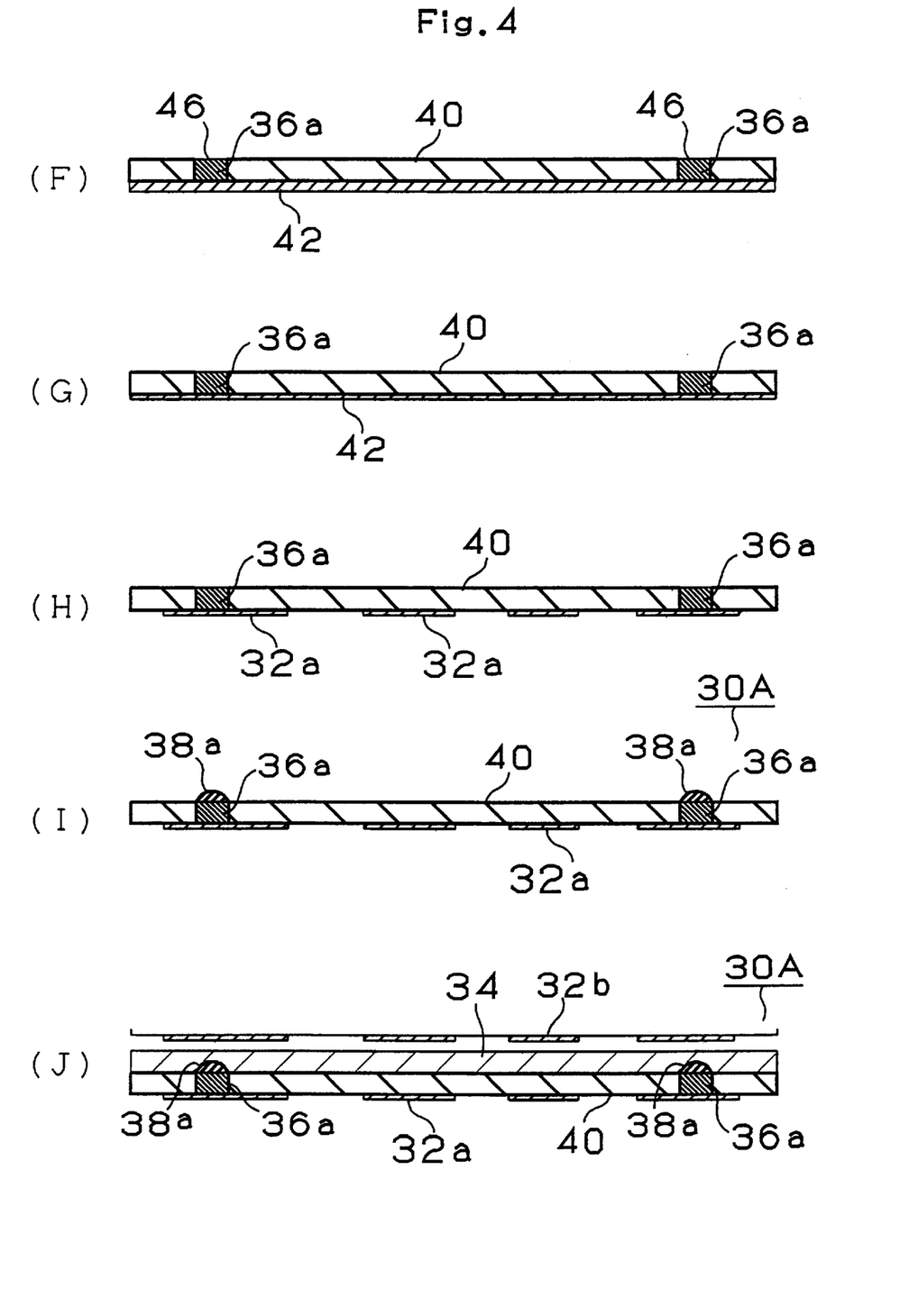
FIG. 4 is a diagram showing a process for manufacturing the single-sided circuit substrate which constitutes the multilayer printed circuit board according to the embodiment of the present invention.

Description of the method of manufacturing the single-sided circuit substrate 30 will now be continued with reference to FIGS. 3 and 4. In process (A) shown in FIG. 3, an insulating base member 40 having a metal layer 42 formed on either surface thereof is used as a starting material. The insulating base member 40 must be an organic insulating base member. Specifically, it is preferable that a base member is selected from rigid laminates including an aramide nonwoven fabric cloth-epoxy resin base member, a glass cloth epoxy resin base member, an aramide nonwoven fabric cloth-polyimide base member and a bismaleimide-triazine resin base member or films including a polyphenylene (PPE) film and a polyimide (PI) film.

It is preferable that the insulating base member 40 is a rigid laminated base member. In particular, it is preferable that a single-sided circuit substrate is employed. The reason for this lies in that displacement of the positions of the wiring pattern and the via holes can be prevented during handling which is performed after the metal layer 42 has been etched. That is, excellent accuracy of the position can be realized.

The metal layer 42 formed on the insulating base member 40 may be copper foil. The copper foil may be subjected to a matting process in order to improve the adhesiveness. The single-sided circuit substrate is a substrate which can be obtained by heat-pressing a laminate of prepreg and copper foil, the prepreg being in the form of a B-stage constituted by causing a glass cloth to be impregnated with thermosetting resin, such as epoxy resin, phenol resin or bismaleimide-triazine resin. The single-sided circuit substrate is a rigid substrate which can easily be handled and which is an advantage substrate from the viewpoint of cost reduction. Metal may be evaporated on the surface of the insulating base member 40, followed by forming a metal layer by performing electrolytic plating.

The thickness of the insulating base member 40 is 10 $\mu$m to 200 $\mu$m, preferably 15 $\mu$m to 100 $\mu$m. The optimum thickness is 20 $\mu$m to 80 $\mu$m to maintain insulating characteristics. If the thickness is smaller than the above-mentioned ranges, the strength is decreased excessively to perform easy handling. If the thickness is too large, formation of small via holes is inhibited and enclosing of the conductive material cannot easily be performed.

The thickness of the metal layer 42 is 5 $\mu$m to 35 $\mu$m, preferably 8 $\mu$m to 30 $\mu$m, and more preferably 12 $\mu$m to 25 mm. If the thickness is too small, a hole attempted to be formed by a laser process as described later is undesirably formed into a through hole. If the thickness is too large, a fine pattern cannot be formed by the etching process.

Then, the laser irradiation process is performed to form non-penetrating holes 40*a* in the insulating base member 40 (process (B)). The laser processing machine may be a carbon dioxide gas laser processing machine, an UV laser processing machine or an excimer laser processing machine. It is preferable that the caliber of the laser processing machine is 20 $\mu$m to 150 $\mu$m. The carbon dioxide gas laser processing machine exhibits high processing speed, enabling the cost of the process to be reduced. Therefore, the foregoing laser processing machine is a most suitable machine from a viewpoint of industrial use. Therefore, the foregoing laser processing machine is a most suitable machine for the present invention. When the carbon dioxide gas laser processing machine is employed, resin existing in the non-penetrating hole 40*a* and slightly melted onto the surface of the metal layer 42 is easily left. Therefore, it is preferable that a desmear process is performed to maintain the reliability of the connection.

Then, a conductive material 46 is enclosed in the non-penetrating holes 40*a* formed by the laser process so that via holes 36*a* are formed (process (E)). The conductive material 46 can be enclosed by electrolytic plating or electroless plating. As an alternative to this, conductive paste may be enclosed or a portion of electrolytic plating or electroless plating may be enclosed, followed by enclosing conductive paste into a residual portion. The conductive paste may be conductive paste made of metal particles made of one or more materials selected from silver, copper, gold, nickel and solder. As the metal particles, a material may be employed which is obtained by coating the surfaces of the metal particles with different metal. Specifically, metal particles may be employed which are obtained by coating the surfaces of copper particles with noble metal selected from gold and silver.

It is preferable that the conductive paste is organic conductive paste obtained by adding thermosetting resin, such as epoxy resin or polyphenylene sulfide (PPS), to the metal particles.

In this embodiment, the small holes each having a diameter of 20 $\mu$m to 150 $\mu$m are formed by the laser process. Since the foregoing holes are non-penetrating holes, the conductive paste cannot reliably be enclosed because air bubbles are easily left. Therefore, the electrolytic plating is a preferred means from a viewpoint of practical use. The electrolytic plating maybe, for example, copper, gold, nickel or solder plating. Most suitable electrolytic plating is copper electrolytic plating.

When the electrolytic plating is employed to perform the enclosure, the metal layer 42 formed on the organic insulating base member 40 is used as the lead for the electrolytic plating. Since the metal layer 42 is formed on the overall surface of the organic insulating base member 40, the density of the electric field can be uniformed. Therefore, the non-penetrating holes can be enclosed with the electrolytic plating such that a uniform height is realized. It is preferable that the surface of the metal layer 42 in each of the non-penetrating holes 40*a* is subjected to an activating process using acid or the like. When plating is performed, it is preferable that deposition of the electrolytic plating on the surface of the metal layer 42 provided for the organic insulating base member 40 is prevented by applying a mask 48 on the metal layer 42 in process (C). As an alternative to this, in process (D), two insulating base members 40 are laminated and brought into hermetic contact with each other to prevent contact with the plating solution during the electrolytic plating process.

After the electrolytic plating has been completed, a portion of the electrolytic plating (metal 46) projecting over the non-penetrating holes 40*a* may be removed by grinding or the like to flatten the surface in process (F) shown in FIG.

4. The grinding process may be performed by using a belt sander or by buffing.

In process (G), a process which is performed before the metal layer 42 is etched to form the conductive circuit and which is a process for easily forming a fine pattern is carried out with which the non-penetrating holes are previously formed by a laser process, followed by etching the overall surface of the metal layer 42 to reduce the thickness to about 1 µm to about 10 µm, preferably about 2 µm to about 8 µm.

As shown in process (H), a mask having a predetermined pattern is applied, and then the metal layer 42 is etched to form the conductive circuit 32a. Initially, a photosensitive dry film is applied or liquid-type photosensitive resist coat is applied. Then, exposure and development are performed to conform to the predetermined circuit pattern so that an etching resist is formed. Then, the metal layer in the portions in which the etching resist is not formed is etched so that a conductor pattern is formed. It is preferable that the etching is performed by using solution of at least one type of material selected from sulfuric acid-hydrogen peroxide, persulfate, cupric chloride and ferric chloride.

Note that the uppermost pattern may be formed by etching the metal layer after the heat pressing process has been completed. When the metal layer is etched after the heat pressing process has been completed, an advantage can be realized in that heat pressing can be performed with uniform pressure because the surfaces which must be pressed are flat surfaces.

It is preferable that the surface of the conductive circuit 32a is subjected to a coarsening process. The reason for this lies in that the adhesiveness with the adhesive layer 34 described with reference to FIG. 1 can be improved in the foregoing case to prevent separation (delamination). The coarsening process may be, for example, a soft etching process, a blackening (oxidizing)-reducing process, formation of needle-shape alloy plating ("INTERPLATE" which is trade name of Ebara) of copper-nickel-phosphorus or surface coarsening process using etching solution "MECH ETCHBOND" which is trade name of Mech.

In process (I), bumps 38a are formed on the surfaces of the via holes 36a opposite to the surface on which the conductive circuit 32a has been formed. The bumps 38a can be formed by, for example, a method with which conductive paste is screen-printed by using a metal mask having openings formed at predetermined positions, a method with which paste of solder which is metal having a low melting point is printed, a method with which solder plating is performed or a method with which immersion in solution in which solder has been melted is performed.

The metal having the low melting point may be Pb-Sn type solder, Ag-Sn type solder or indium solder.

It is preferable that the height of each bump is 3 µm to 60 µm. If the height is smaller than 3 µm, absorption of dispersion of the heights of the bumps by virtue of deformation of the bumps cannot be realized. If the height is larger than 60 µm, the resistance value is raised excessively. What is worse, the bumps are expanded in the lateral direction when the bumps have been deformed, causing short circuit to occur.

When the conductive paste is enclosed in the non-penetrating holes 40, formation of the bumps can be performed simultaneously with the enclosure. In the foregoing state or before the bump are formed, inspections of the conductive circuit 32a and the via holes 36a can be performed. The conventional multilayer printed circuit board permits the inspection of the conductive circuit to be performed only after lamination has been performed, that is, after completion. As compared with this, whether or not the single-sided circuit substrate 30A has a defect can be inspected before the laminating operation. Since only single-sided circuit substrate 30A free from any defect can be used in a laminating process to be described later, a satisfactory high yield of the multilayer printed circuit board can be obtained.

Finally, in process (J), the overall surface of the insulating base member 40 adjacent to the bumps 38a or the overall surface of the insulating base member 40 adjacent to the conductive circuits 25, 32b and conductive circuit 32c is coated with resin. Then, the resin is dried so that an adhesive layer 34 constituted by non-hardened resin is formed.

The adhesive layer 34 may be formed by coating the overall surface of the single-sided circuit substrate on which the conductive circuit has been formed, the overall opposite surface or the overall surface of substrate 20 on which the conductive circuit 32b has been formed, the substrate 20 being a substrate having a conductive circuit. Therefore, a necessity for forming holes for establishing conduction in the adhesive layer can be eliminated. It is preferable that the adhesive layer 34 is made of organic adhesive agent. It is preferable that the organic adhesive agent is a resin selected from epoxy resin, polyimide resin, thermosetting polyphenylene ether (PPE), composite resin of the epoxy resin and the thermosetting resin, composite resin of epoxy resin and silicon resin or BT resin.

The non-hardened resin which is the organic adhesive agent can be applied by using a curtain coater, a spin coater, a roll coater or a spray coater or by screen printing. Also the formation of the adhesive layer can be performed by laminating an adhesive sheet. It is preferable that the thickness of the adhesive layer is 5 µm to 50 µm. To facilitate handling, it is preferable that the adhesive layer is pre-cured.

Figure 5:
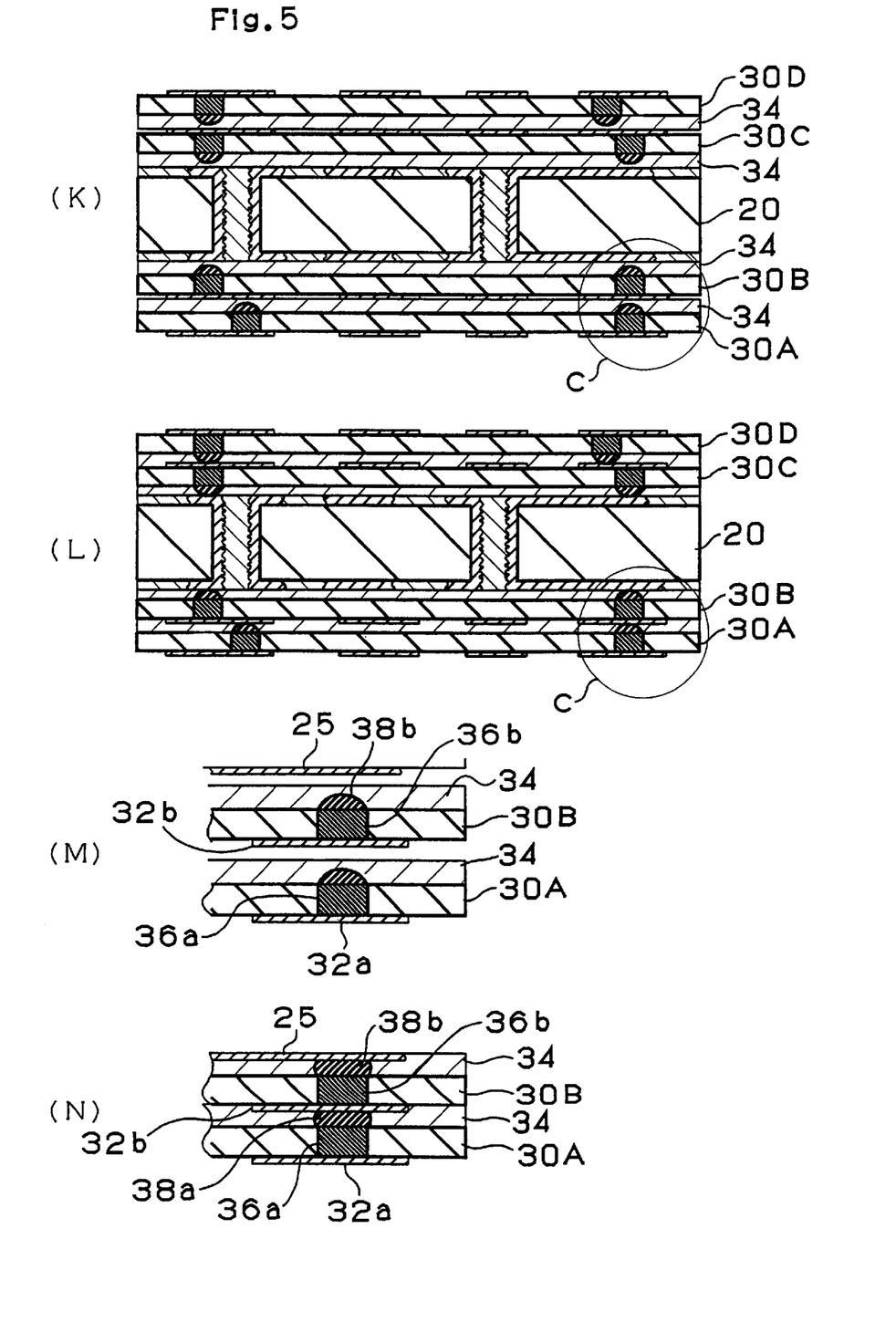
FIG. 5 is a diagram showing a process for manufacturing the multilayer printed circuit board according to the embodiment of the present invention.

The process of laminating the core substrate 20 described with reference to FIG. 2 and the single-sided circuit substrate 30 described with reference to FIGS. 3 and 4 will continuously be described with reference to FIG. 5.

In process (K), the single-sided circuit substrate 30A, the single-sided circuit substrate 30B, 30C and 30D formed by a process similar to the above-mentioned process and the core substrate 20 are laminated. All of the single-sided circuit substrates 30A, 30B, 30C and 30D and the core substrate 20 must be substrates subjected to inspection for a defective portion. Initially, the single-sided circuit substrate 30B is placed on the organic adhesive layer 34 of the single-sided circuit substrate 30A, while the core substrate 20 is placed on the organic adhesive layer 34 of the single-sided circuit substrate 30B. The foregoing substrate are laminated on the core substrate in such a manner that the single-sided circuit substrates 30C and 30D are inverted, that is, the organic adhesive layer 34 of the single-sided circuit substrate 30C faces the core substrate 20. Moreover, the organic adhesive layer 34 of the single-sided circuit substrate 30D faces the single-sided circuit substrate 30C. The lamination is performed while position alignment being performed by inserting a guide pin (not shown) into a guide hole (not shown) formed around the single-sided circuit substrate 30 and the core substrate 20. A portion of circle C of the laminated substrate shown in the drawing is indicated by enlarging the same in (M). The position alignment may be performed by an image process.

Finally, in process (L), the laminated substrates are heated to 150° C. to 200° C. by using a heating press and applied with pressure of 5 kgf/cm$^2$ to 100 kgf/cm$^2$, preferably 20 kgf/cm² to 50 kgf/cm². Thus, the single-sided circuit substrates 30A, 30B, 30C and 30D and the core substrate 20 are integrated into a multilayer structure by one press molding operation. A portion of circle C of the laminated substrates shown in the drawing is shown in (N). Since the pressure is applied, the bump 38a of the single-sided circuit substrate 30A squeezes out the non-hardened resin (the insulating resin) existing between the bump 38a and the conductive circuit 32b adjacent to the single-sided circuit substrate 30B. Thus, the bump 38a is brought into contact with the conductive circuit 32b so that the connection between the bump 38a and the conductive circuit 32b is established. Similarly, the bumps 38b, 38c and 38d of the single-sided circuit substrate 30B, 30C and 30D and the conductive circuit are connected to one another. Since also heat is applied simultaneously with exertion of the pressure, the adhesive layer 34 of the single-sided circuit substrate 30A is hardened so that strong adhesion is realized with the single-sided circuit substrate 30B. It is preferable that the heating press is vacuum heating press. As a result, the multilayer printed circuit board 10 described with reference to FIG. 1 can be manufactured.

Another embodiment will now be described with reference to FIGS. 7 to 9.

Figure 7:
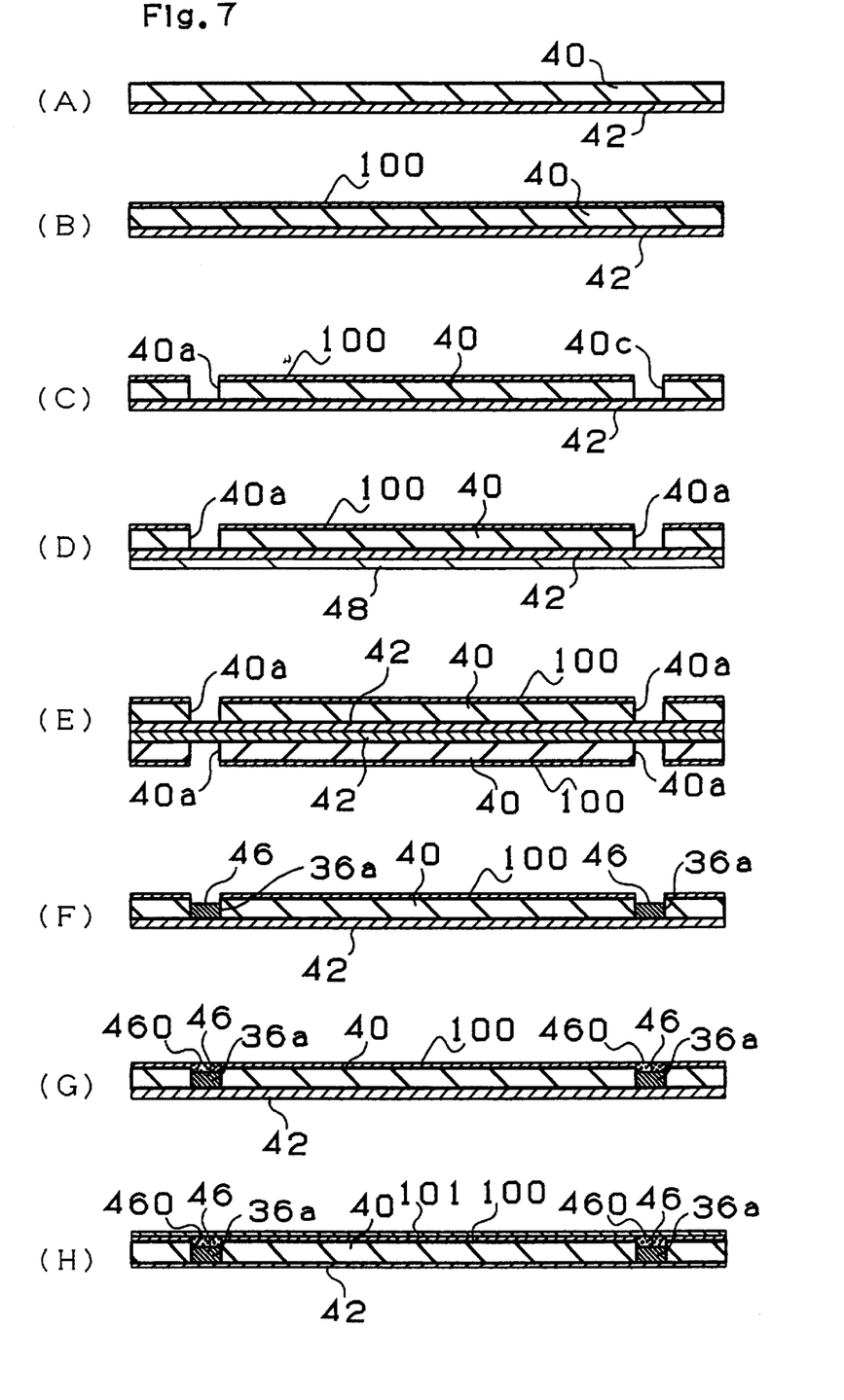
FIG. 7 is a diagram showing a process for manufacturing the core substrate which constitutes the multilayer printed circuit board according to the embodiment of the present invention.

In process (B), a protective film 100 which is usually used as a mask serving in a process for printing conductive paste is bonded to a single-sided copper-clad laminate 40 which has been prepared in process (A) shown in FIG. 7. In process (C), an operation for laser-processing the single-sided copper-clad laminate 40 is performed so that non-penetrating holes 40a are formed. The protective film 100 may be a Mylar film or a release sheet. For example, a polyethylene terephthalate film (PET) having an adhesive layer formed on the surface thereof may be employed. Then, deposition of plating onto the metal layer 42 must be prevented by bonding a mask 48 in process (D). As an alternative to this, the metal layers 42 are brought into hermetic contact with each other in process (E) to prevent contact with the electrolytic plating solution. In process (F) a portion of the non-penetrating holes is filled with electrolytic plating 46. In process (G) conductive paste 460 is enclosed in residual spaces. In the foregoing embodiment, dispersion of the heights of the electrolytic plating can be corrected by using conductive paste so that the heights of the bumps are uniformed.

Figure 8:
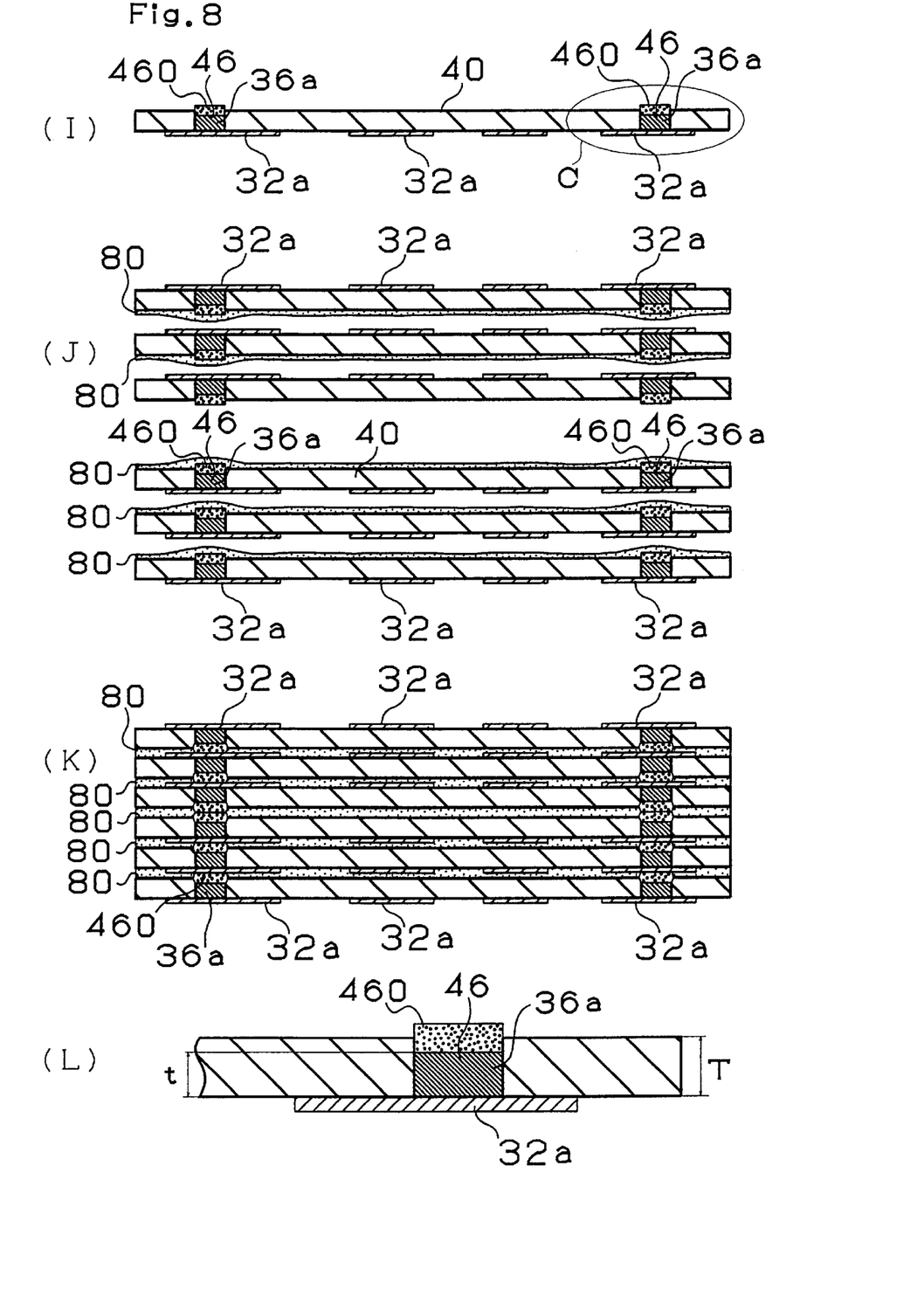
FIG. 8 is a diagram showing a process for manufacturing the core substrate which constitutes the multilayer printed circuit board according to the embodiment of the present invention.
Figure 9:
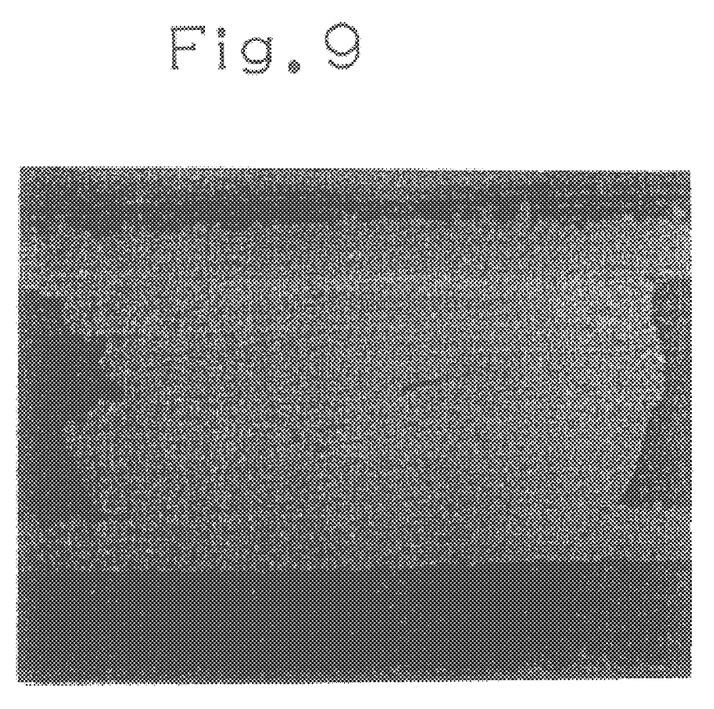
FIG. 9 is an enlarged photograph showing a metal structure of the cross section of a via hole in the multilayer printed circuit board according to the embodiment of the present invention.

An average charging rate of the electrolytic plating in the non-penetrating holes (heights t of electrolytic plating ×100/depth T of the non-penetrating holes: refer to (L) to FIG. 8 (L) which is an enlarged view of portion C shown in FIG. 8 (I)) is not lower than 50% and lower than 100%, preferably 55% to 95%.

The conductive paste enclosed in the opening portions of the protective film 100 is formed into bumps. In process (H) a film 101 for protecting the conductive paste is bonded. Then, the metal layer 42 is etched so that a conductive circuit 32a is formed. Then, the films 100 and 101 are removed to expose the bumps so that a single-sided circuit substrate 30E is obtained (refer to process (I)).

It is preferable that the bumps made of the conductive paste is in a semi-hardened state. Since the conductive paste is hard if it is in the semi-hardened state, the conductive paste is able to penetrate the organic adhesive layer softened during the heat pressing process. When the heat pressing process is performed, the conductive paste is deformed, causing the area of contact to be enlarged. As a result, the conduction resistance can be lowered and dispersion of the heights of the bumps can be corrected. FIG. 9 shows an enlarged photograph of the structures of the via hole and the bump portion.

Then, an organic adhesive agent 80 is applied to the single-sided circuit substrate 30E obtained by performing steps (A) to (I). Then, in process (J), three layers for each side are placed opposite to each other through the adhesive layers. The lamination is performed while position alignment is being performed by inserting a guide pin (not shown) into a guide hole (not shown) formed in the peripheries of the single-sided circuit substrate 30 and the core substrate 20. The position alignment may be performed by performing an image process.

Then, the multilayer printed circuit board 10 structured in process (K) may be manufactured by performing heat pressing.

In the foregoing embodiment, the multilayer printed circuit boards have four laminated single-sided circuit substrates 30 and six laminated single-sided circuit substrates 30, respectively. The structure according to the present invention may be applied to a multilayer printed circuit board having three layers or five or more layers. The single-sided circuit substrates according to the present invention may be laminated on a single-sided printed circuit board, a double-sided printed circuit board, a double-sided through-hole printed circuit board or a multilayer printed circuit board to manufacture a multilayer printed circuit board.

Although the foregoing embodiment has the structure that the holes for forming the via holes are formed by the laser process, the holes may be formed by a mechanical method, such as drilling, punching or the like.

The multilayer printed circuit board according to the present invention may be subjected to a variety of usual processes to which the printed circuit board has been subjected. For example, formation of solder resist on the surface, nickel/gold plating, soldering, hole formation, a cavity forming process and plating of through holes may be performed.

As described above, the multilayer printed circuit board and a manufacturing method therefor according to the present invention are arranged such that the single-sided circuit substrates each having a conductive circuit which incorporates a predetermined wiring pattern formed thereon are previously and individually manufactured. Therefore, inspection for detecting whether or not the conductive circuit or the like has a defective portion can be performed before the single-sided circuit substrates are laminated. Hence it follows that only single-sided circuit substrates free from any defect can be used in the laminating process. That is, the manufacturing method according to the present invention is able to reduce defects in the manufacturing process. As a result, the multilayer printed circuit board having the IVH structure can be manufactured with a high manufacturing yield.

The method of manufacturing a multilayer printed circuit board according to the present invention is not required to repeat the heating press operation while the prepreg is being laminated as distinct from the conventional technique. That is, the present invention enables heat pressing operation to be completed at a time such that a plurality of the single-sided circuit substrate are laminated through the adhesive agents placed on the single-sided circuit substrates. Therefore, the manufacturing method according to the present invention is free from a necessity for repeating the laminating process in which the complicated heat press is performed and the patterning process. Hence it follows that the multilayer printed circuit board having the IVH structure can efficiently be manufactured. Since the single-sided circuit substrates are integrated with physical force exerted in one time of the pressing operation, the reliability of the connection can be improved.

In the present invention, formation of the non-penetrating hole in the organic insulating base member is performed by the laser process. In the present invention, the previous formation of the conducting hole in the organic adhesive layer is not required. The necessity for simultaneously forming holes in the insulating base member and the adhesive layer by the laser process can be eliminated. That is, after the holes have been formed in the insulating base member by the laser process, the adhesive layer can be formed on the single-sided circuit substrate or the substrate having the conductive circuit. Therefore, the desmear process, which is performed after the holes have been formed can be performed before the adhesive layer is formed. As a result, the desmear process does not erode the organic adhesive layer.

Also in a case where the non-penetrating hole is filled with the electrolytic plating, the adhesive layer can be formed on the single-sided circuit substrate or the substrate having the conductive circuit after the non-penetrating hole has been formed in the insulating base member by performing the laser process and the non-penetrating hole has been filled with the electrolytic plating. Therefore, the electrolytic plating solution and the adhesive layer are not made contact with each other. As a result, the erosion of the adhesive layer with the plating solution can be prevented.

Since the adhesive layer is not hardened until the heat pressing process which is the final process is performed, the adhesive layer easily deteriorates during the desmear process or the plating solution. The present invention has characteristics that the above-mentioned problem can be prevented and a reliable substrate can be easily formed.

Moreover, a necessity for previously forming a conducting hole in the adhesive layer can be eliminated according to the present invention. Therefore, defective conduction caused from deviation in the positions of the hole in the adhesive layer and the projecting conductors provided for the organic insulating base member can be prevented.

In the present invention, the projecting conductors are formed on the via holes filled with the conductive paste or the electrolytic plating. Therefore, the electrical connection between the upper and lower conductive layers can be easily established by penetrating the relatively thin organic adhesive layer. Therefore, the height and the diameter of each projecting conductor can be reduced. Hence it follows that the pitch between adjacent projecting conductors can be shortened. Therefore, the pitch between adjacent via holes can also be shortened. As a result, addressing to raising of the density can be permitted.

In a case where the via holes are filled with the electrolytic plating, the resistance value between the upper and the lower conductor layers can be lowered.

Although embodiments of the invention have been shown and described, it is to be understood that various modifications, substitutions, and rearrangements of parts, components, elements and process steps can be made by those skilled in the art without departing from the novel spirit and scope of this invention.

What is claimed is:

1. A multilayer printed circuit board having a structure with single-sided circuit substrates, each of said single sided substrates having a conductive circuit formed on one side of an insulating base member thereof and via holes formed in said insulating base member enclosing a conductive material, each of said single-sided substrates having a conductive circuit through adhesive layers, said multilayer printed circuit board comprising:

bottom sides of said via holes blocked with said conductive circuit and top sides of the via holes enclosed with the conductive material, said top sides of the via holes being almost flat with the upper side of the insulating base member;

projecting conductors formed on the surfaces of via holes opposite to the surface of said insulating base member on which said conductive circuit is formed; wherein said projecting conductors penetrate said adhesive layers so as to be connected to said conductive circuits of the other substrates.

2. A multilayer printed circuit according to claim 1, wherein said conductive material is electrolytic copper plating.

3. A multilayer printed circuit board according to claim 1, wherein said projecting conductors are made of conductive paste or metal having a low melting point.

4. A multilayer printed circuit board according to claim 1, wherein said adhesive layer is formed by coating or laminating said adhesive layer on the overall surface of said single-sided circuit substrate on which said conductive circuit has been formed, the overall surface of said single-sided circuit substrate opposite to the surface of said single-sided circuit substrate on which said conductive circuit has been formed or the overall surface of the other circuit having said conductive circuit on which said conductive circuit has been formed.

5. A multilayer printed circuit board according to claim 1, wherein a surface of said conductive material is subjected to a coarsening.

6. A multilayer printed circuit board having a structure with single-sided circuit substrates, each of said single-sided substrates having a conductive circuit formed on one side of an organic insulating base member thereof and via holes formed in said organic insulating base member enclosing a conductive material, each of said single-sided circuit substrates having a conductive circuit through organic adhesive layers, said multilayer printed circuit board comprising:

bottom sides of said via holes blocked with said conductive circuit and top sides of the via holes enclosed with the conductive material so as to be almost flat with the upper side of the insulating base member;

projecting conductors formed on the surfaces of said via holes opposite to the surface of said organic insulating base member on which said conductive circuit is formed; wherein said projecting conductors penetrate said adhesive layers so as to be connected to said conductive circuits of the other substrates.

7. A multilayer printed circuit board according to claim 6, wherein said projecting conductors are made of conductive paste or metal having a low melting point.

8. A multilayer printed circuit board according to claim 6, wherein said adhesive layer is formed by coating or laminating said adhesive layer on the overall surface of said single-sided circuit substrate of which said conductive circuit has been formed, the overall surface of said single-sided circuit substrate opposite to the surface of said single-sided circuit substrate on which said conductive circuit has been formed or the overall surface of the other circuit having said conductive circuit on which said conductive circuit has been formed.

9. A multilayer printed circuit board according to claim 6, wherein said conductive material is electrolytic copper plating.

10. A multilayer printed circuit board according to claim 6, wherein a surface of said conductive material is subject to a coarsening.

11. A method of manufacturing a multilayer printed circuit board at least comprising the steps of:
(1) forming a non-penetrating hole in an insulating base member having a metal layer formed on either surface of an insulated layer thereof by a laser irradiation operation such that said non-penetrating hole reaches said metal layer;
(2) forming via holes by enclosing a conductive material into said non-penetrating hole so that the conductive material is almost flat with the insulating base member;
(3) forming a conductive circuit be etching said metal layer;
(4) forming projecting conductors on the surfaces of said via holes formed on the surface opposite to the surface on which said conductive circuit has been formed to form a single-sided circuit substrate; and
(5) laminating said single-sided circuit substrate and another single-sided circuit substrate such that said projecting conductors of said single-sided circuit substrate and a conductive circuit of another single-sided circuit substrate are positioned opposite to each other through an adhesive layer and applying heat and pressure to the laminate to cause said projecting conductors to be inserted to penetrate said adhesive layer so as to be connected and integrated with said conductive circuit of the other substrate.

12. A method of manufacturing a multilayer printed circuit board according to claim 11, wherein said conductive material is electrolytic copper plating.

13. A method of manufacturing a multilayer printed circuit board according to claim 11, wherein said projecting conductors are made of conductive paste or metal having a low melting point.

14. A method of manufacturing a multilayer printed circuit board according to claim 11, wherein said adhesive layer is formed by coating or laminating said adhesive layer on the overall surface of said single-sided circuit substrate on which said conductive circuit has been formed, the overall surface of said single-sided circuit substrate opposite to the surface of said single-sided circuit substrate on which said conductive circuit has been formed or the overall surface of the other circuit having said conductive circuit on which said conductive circuit has been formed.

15. A method of manufacturing a multilayer printed circuit board according to claim 11, further comprising the step of coarsening a surface of said conductive material.

16. A method of manufacturing a multilayer printed circuit board at least comprising the steps of:
(1) forming a non-penetrating hole in an insulating base member having a metal layer formed on either surface of an insulating layer thereof by a laser irradiation operation such that said non-penetrating hole reaches said metal layer;
(2) forming via holes by enclosing a conductive material into said non-penetrating hole so that said conductive material is almost flat with the insulating base member and forming projecting conductors on the surfaces of said via holes to form a single-sided circuit substrate;
(3) forming a conductive circuit by etching said metal layer; and
(4) laminating said single-sided circuit substrate and another single-sided circuit substrate such that projecting conductors of said single-sided circuit substrate and a conductive circuit of another single-sided circuit substrate are positioned opposite to each other through an adhesive layer and applying heat and pressure to the laminate to cause said projecting conductors to be inserted to penetrate said adhesive layer so as to be connected and integrated with said conductive circuit of the other substrate.

17. A method of manufacturing a multilayer printed circuit board according to claim 16, wherein said conductive material is electrolytic copper plating.

18. A method of manufacturing a multilayer printed circuit board according to claim 16, wherein said projecting conductors are made of conductive paste or metal having a low melting point.

19. A method of manufacturing a multilayer printed circuit board according to claim 16, wherein said adhesive layer is formed by coating or laminating said adhesive layer on the overall surface of said single-sided circuit substrate on which said conductive circuit has been formed, the overall surface of said single-sided circuit substrate opposite to the surface of said single-sided circuit substrate on which said conductive circuit has been formed or the overall surface of the other circuit having said conductive circuit on which said conductive circuit has been formed.

20. A method of manufacturing a multilayer printed circuit board according to claim 21, further comprising the step of coarsening a surface of said conductive material.

21. A method of manufacturing a multilayer printed circuit board at least comprising the steps of:
(1) forming a non-penetrating hole in an organic insulating base member having a metal layer formed on either surface of an insulating layer thereof by a laser irradiation operation such that said non-penetrating hole reaches said metal layer;
(2) forming via holes by enclosing a conductive material into said non-penetrating hole so that the conductive material is almost flat with the insulating base member;
(3) forming a conductive by etching said metal layer;
(4) forming projecting conductors on the surfaces of said via holes formed on the surface opposite to the surface on which said conductive circuit has been formed to form a single-sided circuit substrate; and
(5) laminating said single-sided circuit substrate and another single-sided circuit substrate such that said projecting conductors of said single-sided circuit substrate circuit substrate and a conductive circuit of another single-sided circuit substrate are positioned opposite to each other through an organic adhesive layer and applying heat and pressure to the laminate to cause said projecting conductors to be inserted to penetrate said adhesive layer so as to be connected to said conductive circuit of the other substrate.

22. A method of manufacturing a multilayer printed circuit board according to claim 21, wherein said conductive material is electrolytic copper plating.

23. A method of manufacturing a multilayer printed circuit board according to claim 21, wherein said projecting conductors are made of conductive paste or metal having a low melting point.

24. A method of manufacturing a multilayer printed circuit board according to claim 21, wherein said adhesive layer is formed by coating or laminating said adhesive layer on the overall surface of said single-sided circuit substrate on which said conductive circuit has been formed, the overall surface of said single-sided circuit substrate opposite to the surface of said single-sided circuit substrate on which said conductive circuit has been formed or the overall surface of the other circuit having said conductive circuit on which said conductive circuit has been formed.

25. A method of manufacturing a multilayer printed circuit board according to claim 21, further comprising the step of coarsening a surface of said conductive material.

26. A method of manufacturing a multilayer printed circuit board at least comprising the steps of:
(1) forming a non-penetrating hole in an organic insulating base member having a metal layer formed on either surface of an insulating layer thereof by a laser irradiation operation such that said non-penetrating hole reaches said metal layer;
(2) forming via holes by enclosing a conductive material into said non-penetrating hole so that said conductive material is almost flat with the insulating base member and forming projecting conductors;
(3) forming a conductive circuit by etching said metal layer to form a single-sided circuit substrate; and
(4) laminating said single-sided circuit substrate and another single-sided circuit substrate such that said projecting conductors of said single-sided circuit substrate and a conductive circuit of another single-sided circuit substrate are positioned opposite to each other through an organic adhesive layer and applying heat and pressure to the laminate to cause said projecting conductors to be inserted to penetrate said organic adhesive layer so as to be connected to said conductive circuit of the other substrate.

27. A method of manufacturing a multilayer printed circuit board according to claim 26, wherein said conductive material is electrolytic copper plating.

28. A method of manufacturing a multilayer printed circuit board according to claim 26, wherein said projecting conductors are made of conductive paste or metal having a low melting point.

29. A method of manufacturing a multilayer printed circuit board according to claim 26, wherein said adhesive layer is formed by coating or laminating said adhesive layer on the overall surface of said single-sided circuit substrate on which said conductive circuit has been formed, the overall surface of said single-sided circuit substrate opposite to the surface of said single-sided circuit substrate on which said conductive circuit has been formed or the overall surface of the other circuit having said conductive circuit on which said conductive circuit has been formed.

30. A method of manufacturing a multilayer printed circuit board according to claim 26, further comprising the step of coarsening a surface of said conductive material.

31. A multilayer printed circuit board having a structure with single-sided circuit substrates, each of said single-sided circuit substrates having a conductive circuit formed on one side of an insulating base member thereof and via holes formed in said insulating base member by enclosing a conductive material, each of said single-sided circuit substrates having a conductive circuit through adhesive layers, said multilayer printed circuit board comprising:

bottom sides of said via holes blocked with said conductive circuit and other sides of the via holes filled with the conductive material to a depth between 50% and 100%;

projecting conductors formed on the surfaces of said via holes opposite to the surface of said insulating base member on which said conductive circuit is formed; wherein said projecting conductors penetrate said adhesive layers so as to be connected to said conductive circuits of the other substrates.

* * * * *